United States Patent [19]

Takada et al.

[11] Patent Number: 4,898,805
[45] Date of Patent: Feb. 6, 1990

[54] METHOD FOR FABRICATING HYBRID INTEGRATED CIRCUIT

[75] Inventors: Mitsuyuki Takada; Hayato Takasago; Yoichiro Onishi, all of Hyogo, Japan

[73] Assignee: Mitsubishi Denki Kabushiki Kaisha, Tokyo, Japan

[21] Appl. No.: 224,175

[22] Filed: Jul. 25, 1988

[51] Int. Cl.$^4$ .............................................. G03C 5/00
[52] U.S. Cl. ................................. 430/315; 430/311; 430/313; 430/318; 427/98
[58] Field of Search ............... 430/311, 313, 315, 318, 430/319; 427/98, 96

[56] References Cited

U.S. PATENT DOCUMENTS

| | | | |
|---|---|---|---|
| 4,150,995 | 4/1979 | Moritsu et al. | 106/1.21 |
| 4,487,811 | 12/1984 | Eichelberger et al. | 428/546 |
| 4,629,681 | 12/1986 | Takada et al. | 430/314 |
| 4,685,203 | 8/1987 | Takada et al. | 29/620 |
| 4,752,555 | 6/1988 | Takada et al. | 430/314 |

FOREIGN PATENT DOCUMENTS 59-112681 6/1984 Japan .

Primary Examiner—Jose G. Dees
Attorney, Agent, or Firm—Lowe, Price, LeBlanc, Becker & Shur

[57] ABSTRACT

A method for fabricating a hybrid IC substrate comprises the steps of baking a conductor of a first group on an insulating ceramic substrate, forming an insulating porous active layer including a glass component and a small amount of a metal component having a catalytic action for electroless plating, forming a resist pattern on the active layer by using a photomask, and forming a conductor of a second group by electroless plating on a portion of the active layer not covered with the resist, whereby a portion of the active layer sandwiched between the conductors of the first and second groups is rendered conductive and a portion of the active layer in direct contact with the insulating substrate is maintained as an insulator.

11 Claims, 1 Drawing Sheet

METHOD FOR FABRICATING HYBRID INTEGRATED CIRCUIT

RELATED APPLICATION AND PATENT

This application is related to the copending U.S. patent application Ser. No. 825,996 and the U.S. Pat. No. 4,685,203 assigned to the assignee of the present application.

BACKGROUND OF THE INVENTION

1. Field of the Invention

This invention pertains to a method for fabricating a hybrid IC (integrated circuit) substrate and particularly to a method for fabricating electric conductors integrated with high density on an insulator substrate.

2. Description of the Prior Art

According to a conventional method for forming a conductor layer by plating on an insulator substrate, a catalyzer (e.g., palladium) is absorbed on the whole surface of the substrate and then electroless plating is applied thereto or electroplating is also applied thereafter, so that a conductor layer is formed on the whole surface. After that, a resist layer in a predetermined pattern is formed on the conductor layer and a conductor pattern is formed by etching. (Afterwards, the resist layer is removed.) This conventional method makes it possible to obtain good adhesion of the conductor to the substrate if substrate surface treatment is appropriately applied before absorption of the catalyzer in the case of using a substrate of a composite material such as glass-epoxy. The substrate surface treatment is for example a treatment in which the surface of the substrate is roughened mechanically by using a brush or the like. However, if ceramic such as alumina is used for the substrate, it is difficult to improve the adhesion of the conductor to the substrate by roughening of the surface of the substrate.

FIG. 1 is a partial schematic sectional view of a ceramic circuit substrate disclosed in Japanese Patent Laying-Open No. 112681/1984. In FIG. 1, a tungsten conductor 102 belonging to the first group of conductors is formed on a ceramic substrate 101. The tungsten conductor 102 is covered with a nickel film 103 and a palladium film 104. A thick conductor film 105 of silver-palladium belonging to a second group of conductors is electrically connected with the palladium film 104 and with the tungsten conductor 102 through the nickel film 103. The nickel film 103 and the palladium film 104 are provided to improve adhesion between the tungsten conductor 102 and the palladium conductor 105.

The ceramic circuit substrate of FIG. 1 is fabricated in the below described process. First, the tungsten conductor 102 is provided on a green sheet of ceramic and it is baked in a reducing atmosphere, whereby the ceramic substrate 101 is formed with the tungsten conductor 102 being fixedly stuck thereto. The nickel film 103 is formed on the tungsten conductor 102 by electroless plating and the palladium film 104 is formed on the nickel film 103 by electroplating. After that, silver palladium paste containing a glass component is printed in a predetermined pattern and it is baked in an oxidizing atmosphere at 900° C. so as to be firmly stuck to the ceramic substrate 101 and thus the thick film of the conductor 105 of the second group electrically connected with the tungsten conductor 102 is formed.

However, since the silver palladium paste containing the glass component is provided by screen printing, the patterning precision of the thick film conductor 105 is limited by a precision of screen printing. Further, there is involved a disadvantage that the silver palladium is liable to dissolve into fused solder.

SUMMARY OF THE INVENTION

In view of the above described prior art, it is an object of the present invention to provide a method for forming conductors of the second group with high precision and with fine patterning over a ceramic substrate where conductors of the first group are formed, the conductor of the second group including electric connections with the conductors of the first group.

According to another aspect of the present invention, a method for fabricating a hybrid IC substrate comprises the steps of: preparing an insulating ceramic substrate having a major surface; baking one or more conductors of a first group on the major surface; forming an insulating porous active layer including a glass component and a small amount of a metal component having a catalytic action for electroless plating to cause the active layer to cover the major surface and the conductors of the first group; and forming one or more conductors of a second group by electroless plating on a portion(s) of the active layer, whereby a portion(s) of the active layer sandwiched between the conductors of the first and second groups is rendered conductive and a portion(s) of the active layer in direct contact with the insulating substrate is maintained as an insulator.

According to another aspect of the present invention, a method for fabricating a hybrid IC substrate comprises the steps of: preparing an insulating ceramic substrate having a major surface; baking one or more conductors of a first group on the major surface; forming an insulating porous active layer including a glass component and a small amount of a metal component having a catalytic action for electroless plating to cause the active layer to cover the major surface and the conductors of the first group; covering the active layer with a photosensitive resist layer; patterning the resist layer by using a photomask; and forming one or more conductors of a second group by electroless plating on a portion(s) of the active layer not covered with the patterned resist layer, whereby a portion(s) of the active layer sandwiched between the conductors of the first and second groups is rendered conductive and a portion(s) of the active layer in direct contact with the insulating substrate is maintained as an insulator.

According to a further aspect of the present invention, a method for fabricating a hybrid IC substrate comprises the steps of: preparing an insulating ceramic substrate having a major surface; baking one or more conductors of a first group on the major surface; forming an insulating porous active layer including a glass component and a small amount of a metal component having a catalytic action for electroless plating to cause the active layer to cover the major surface and the conductors of the first group; covering the active layer with an electroless-plated conductor layer; patterning the electroless-plated conductor layer by a photolithographic process to form one or more conductors of a second group, whereby a portions of the active layer sandwiched between the conductors of the first and second groups is rendered conductive and a portions of the active layer in direct contact with the insulating substrate is maintained as an insulator.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
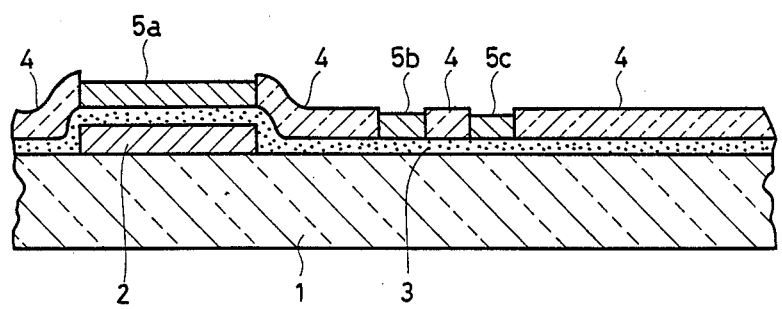
FIG. 2 is a sectional view schematically showing a part of a hybrid IC substrate fabricated by a method of the present invention.

Referring to FIG. 2, first, silver palladium paste is printed with a pattern of a conductor of the first group on an alumina substrate 1 and it is baked at 850° C., whereby a thick conductor film 2 of silver-palladium is formed.

Then, an active layer 3 is formed to cover the substrate 1 and the conductor 2 of the first group. Although the active layer 3 is an insulator, it is porous and has a catalytic action for electroless plating. Such an active layer is obtained by baking of an active paste layer such as CATAPASTE CCP-3730 available from OKUNO CHEMICAL INDUSTRY CO., LTD. Preferably, the active paste layer is formed by screen printing to have an uniform thickness. The active paste which can be used includes for example low melting point glass powder, alumina powder, palladium powder having a catalytic action for electroless plating, organic solvent and resin. The palladium powder contained in the paste is usually only about 0.5 wt%. When the active paste layer is baked at a temperature in the range of 400° to 900° C., the organic solvent and resin are dispersed and the active layer 3 is caused to contain palladium of about 1 wt%. If the active layer 3 is baked at a temperature lower than 400° C., an electric connection cannot be obtained between the conductor 2 of the first group and a conductor 5a of the second group to be formed thereon later. On the other hand, if the active layer 3 is baked at a temperature higher than 900° C., an unfavorable influence is exerted on other circuit components and therefore the baking at such a high temperature is not preferred.

Then, a photosensitive resist layer is coated on the whole surface of the active layer 3 and it is dried. The resist layer is subjected to exposure and development by using a photomask having a pattern of conductors of the second group, whereby a resist pattern 4 for electroless plating is formed. The substrate where the resist pattern 4 is formed is immersed in an electroless plating bath so that conductors 5a, 5b and 5c of copper or nickel of the second group are formed by electroless plating on portions of the active layer 3 not covered with the resist pattern 4.

The active layer 3 itself is an electric insulator. However, the portion of the active layer 3 on the conductor 2 of the first group includes an interdiffused layer near the interface with the conductor 2. In addition, the active layer 3 is porous. Accordingly, the active layer 3 sandwiched between the conductor 2 of the first group and the electroless-plated layer 5a is rendered conductive (for example, 50 mΩ/mm² or less in the sandwiched area) and thus the conductors 2 and 5a can be electrically connected. On the other hand, the portion of the active layer 3 in direct contact with the insulator substrate 1 is maintained as an insulator and the conductors 5a, 5b and 5c are electrically isolated from one another. For example, if the conductors 5b and 5c are separated by 0.1 mm, they are electrically isolated from each other by insulation resistance of more than $10^{13}$ Ω.

Accordingly, the conductor 5a of the second group can be electrically connected with the conductor 2 of the first group without providing a contact hole in the active layer 3. In addition, since the resist pattern 4 is formed by using the photomask, the conductors 5a, 5b and 5c of the second group can be formed with high precision and high density. Furthermore, the conductors 5a, 5b and 5c of the second group, formed of copper or nickel, hardly dissolve into fused solder and they have good resistance to electromigration. Needless to say, the copper conductors have excellent conductivity.

Figure 1:
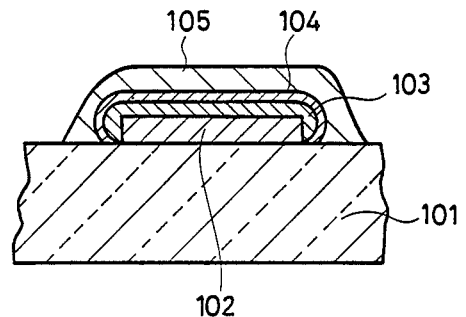
FIG. 1 is a sectional view schematically showing a part of a hybrid IC substrate of the prior art.
Figure 3:
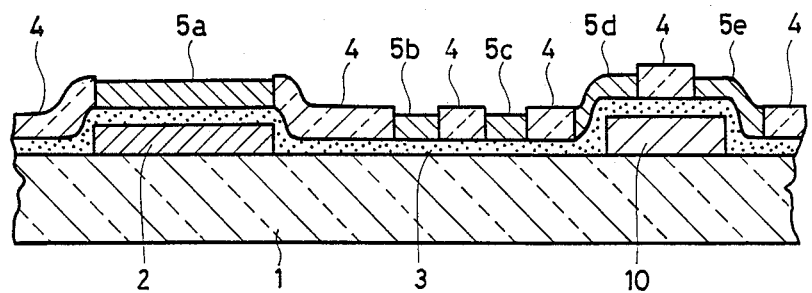
FIG. 3 is a sectional view schematically showing a part of another hybrid IC substrate fabricated by a method of the present invention.

Referring to FIG. 3, another embodiment will be described. A hybrid IC substrate of FIG. 3 is similar to that of FIG. 1 except for the following points. In the hybrid IC substrate of FIG. 3, the conductor pattern of the first group further includes a thick film resistor 10 and the conductor pattern of the second group further includes conductors 5d and 5e. The resistor 10 is formed in a manner in which paste containing ruthenium oxide is printed on the substrate and baked at a maximum temperature of 850° C. All the conductors 5a to 5e of the second group are formed simultaneously by electroless plating.

A portion of the active layer 3 sandwiched between the conductor 10 and the resist layer 4 is maintained as an insulator. On the other hand, a portion of the active layer 3 sandwiched between the resistor 10 and the conductor 5d is rendered conductive. In the same manner, a portion of the active layer 3 sandwiched between the resistor 10 and the conductor 5e is also rendered conductive. Accordingly, the resistor 10 can be connected between the conductors 5d and 5e.

Incidentally, the above described active layer 3 may be formed by the steps of baking a paste layer including glass powder as a major component and containing alumina powder, organic solvent and resin to form a porous insulator layer having fine concavities and convexities on its surface and absorbing an amount of 1 wt% or less of a metal such as palladium having a catalytic action for electroless plating onto the insulator layer.

The conductor 2 of the first group may be formed of platinum-palladium or it may be a conductor of copper, tungsten or molybdenum-manganese alloy, or a conductor plated by such substance.

In addition, the conductors of the second group may be formed by the steps of forming a plated layer on the whole surface of the active layer without using a resist layer and etching and patterning the plated layer by a photolithographic process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating a hybrid IC substrate comprising the steps of:

preparing an insulating ceramic substrate having a major surface, baking one or more conductors of a first group on the major surface, forming an insulating porous active layer including a glass component and a small amount of a metal component having a catalytic action for electroless plating to cause said active layer to cover said major surface and said conductors of the first group, and forming one or more conductors of the second group by electroless plating on said active layer, whereby a portions of said active layer sandwiched between said conductors of the first and the second groups is rendered conductive and a portions of said active layer in direct contact with said insulating substrate is maintained as an insulator.

2. A method in accordance with claim 1, wherein said active layer is formed by coating a paste including a glass component and a small amount of metal having a catalytic action for electroless plating and by baking said paste.

3. A method in accordance with claim 2, wherein said active layer is baked at a temperature in the range from 400° to 900° C.

4. A method in accordance with claim 1, wherein said active layer is formed by baking a porous insulating layer including a glass component and then absorbing a metal having a catalytic action for electroless plating.

5. A method in accordance with claim 1, wherein said metal having the catalytic action for electroless plating is palladium.

6. A method in accordance with claim 1, wherein said conductors of the second group are formed of a metal selected from the group of copper and nickel.

7. A method in accordance with claim 1, wherein said substrate is formed of alumina.

8. A method in accordance with claim 1, wherein said conductors of the first group include a conductor of silver-palladium having good conductivity.

9. A method in accordance with claim 1, wherein said conductors of the first group include a resistor of ruthenium oxide.

10. A method for fabricating a hybrid IC substrate comprising the steps of:

preparing an insulating ceramic substrate having a major surface, baking one or more conductors of a first group on the major surface, forming an insulating porous active layer including a glass component and a small amount of a metal component having a catalytic action for electroless plating to cause said active layer to cover said major surface and said conductors of the first group, covering said active layer with a photosensitive resist layer, patterning said resist layer by using a photomask, and forming one or more conductors of the second group by electroless plating on a portions of a said active layer not covered with the patterned resist layer, whereby a portions of said active layer sandwiched between said conductors of the first and the second groups is rendered conductive and a portions of said active layer in direct contact with said insulating substrate is maintained as an insulator.

11. A method for fabricating a hybrid IC substrate comprising the steps of:

preparing an insulating ceramic substrate having a major surface, baking one or more conductors of a first group on said major surface, forming an insulating porous active layer including a glass component and a small amount of a metal component having a catalytic action for electroless plating to cause said active layer to cover said major surface and said conductors of a first group, and forming one or more conductors of a second group by photolithographically forming a patterned electroless-plated conductor layer on said active layer, p1 whereby a portion of said active layer sandwiched between said conductors of the first and second groups is rendered conductive and a portion of said active layer in direct contact with said insulating substrate is maintained as an insulator.

* * * * *